(12) United States Patent
Choudhary et al.

(10) Patent No.: US 10,720,371 B2
(45) Date of Patent: Jul. 21, 2020

(54) EXTENDED TEMPERATURE OPERATION FOR ELECTRONIC SYSTEMS USING INDUCTION HEATING

(71) Applicant: Intel Corporation, Santa Clara, CA (US)

(72) Inventors: Prakriti Choudhary, Chandler, AZ (US); Arnab Choudhury, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 888 days.

(21) Appl. No.: 15/089,332

(22) Filed: Apr. 1, 2016

(65) Prior Publication Data
US 2017/0287803 A1    Oct. 5, 2017

(51) Int. Cl.
| H01L 23/34 | (2006.01) |
| H05B 6/06 | (2006.01) |
| H05B 6/10 | (2006.01) |
| H01L 23/36 | (2006.01) |

(52) U.S. Cl.
CPC ............ *H01L 23/345* (2013.01); *H01L 23/36* (2013.01); *H05B 6/06* (2013.01); *H05B 6/105* (2013.01)

(58) Field of Classification Search
CPC ..... H01L 23/345; H01L 23/3675; H05B 6/06; H05B 6/105
USPC ................. 219/535, 603, 618, 765
See application file for complete search history.

(56) References Cited

U.S. PATENT DOCUMENTS

| 4,749,833 A | * | 6/1988 | Novorsky | ........... B29C 65/7802 156/272.4 |
| 2006/0289495 A1 | * | 12/2006 | Thomas | .................... H05B 6/06 219/677 |
| 2016/0014850 A1 | * | 1/2016 | Verhagen | ................. H05B 6/08 219/666 |

FOREIGN PATENT DOCUMENTS

WO   WO-2013182591 A3 *  3/2014   ............... C09J 5/06

\* cited by examiner

*Primary Examiner* — Thien S Tran
(74) *Attorney, Agent, or Firm* — Womble Bond Dickinson (US) LLP

(57) ABSTRACT

Embodiments are generally directed to extended temperature operation for electronic systems using induction heating. An embodiment of an apparatus includes an electronic device including: a die or package; a thermal solution coupled with the die or package for cooling of the die or package; and ferromagnetic material, wherein the ferromagnetic material is to generate induction heating of the die or package in response to an alternating magnetic field.

20 Claims, 5 Drawing Sheets

EXTENDED TEMPERATURE OPERATION FOR ELECTRONIC SYSTEMS USING INDUCTION HEATING

TECHNICAL FIELD

Embodiments described herein generally relate to the field of electronic devices and, more particularly, extended temperature operation for electronic systems using induction heating.

BACKGROUND

As high performance electronic devices and circuitry are implemented in new products and expanding uses, there are circumstances in which such electronic devices and circuits may face extreme environmental conditions, and in particular extreme low temperatures.

One of the areas in which these temperature extremes come into play is automotive use, in which electronic device are called upon to operate effectively in both extreme cold and extreme heat. As new safety systems are implemented, electronic systems are required to respond quickly and effectively in all conditions.

However, while heatsinks and other thermal solutions may efficiently address high temperature concerns, conventional solutions for addressing extreme cold are generally ineffective or inefficient for modern electronic systems.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to extended temperature operation for electronic systems using induction heating.

For the purposes of this description:

"Induction heating" or "inductive heating" refers to heating generated in a ferromagnetic material as a result of a rapidly alternating magnetic field.

In some embodiments, an apparatus, system, or method provides for extended temperature operation for electronic systems using induction heating.

In some embodiments, an extended temperature apparatus or system is enabled utilizing induction heating. Most electronic devices work adequately in a temperature range of approximately 0 to 70° C. (degrees Celsius). However, for electronic systems exposed to challenging outside environments (in, for example, a mountain climate) temperatures below 0° C. are common, and will affect operation of the electronics.

In particular, automotive electronics have transformed from simple entertainment systems to complex data, communications, driver assistance, and safety systems. Implementations may include, for example, IVI (In-Vehicle Infotainment), ADAS (Advanced Driver Assistance Systems) and CRAN, which may face ambient operating temperatures ranges that vary from approximately −40° C. to 85° C. With motor vehicles often being exposed to extreme temperatures, the time required for electronics to reach a proper temperature is a critical factor in providing proper operation. Until such temperature is reached, the systems may be nonfunctional or operate at a reduced capacity.

In a particular example, the common rearview camera for a motor vehicle generally replies upon the automotive infotainment system screen. Pursuant to the NTSA (National Traffic Safety Administration) rule mandating rear vision such as rearview cameras on motor vehicles manufactured on or after May 1, 2018, the required field of view to the rear of a vehicle must be displayed to the driver within 2.0 second of placing a motor vehicle in reverse, which does not allow a long period of time for temperature ramp up.

In some embodiments, an apparatus or system includes inductive heating to quickly and efficiently heat the electronics, heating only the portions of devices that require heating and providing a rapid ramp up of temperature with reduced current requirements in comparison with conventional systems because of the high efficiency of the inductive heating. An embodiment of an inductive heating system may further assist in cooling in comparison with conventional solutions by avoiding the addition of any impediments to cooling performance. In addition to other advantages, an inductive heating system ceases producing heat as soon as the current is stopped, thus allowing for the flow of heat to be cut off as soon as the necessary temperature is achieved.

Figure 1:
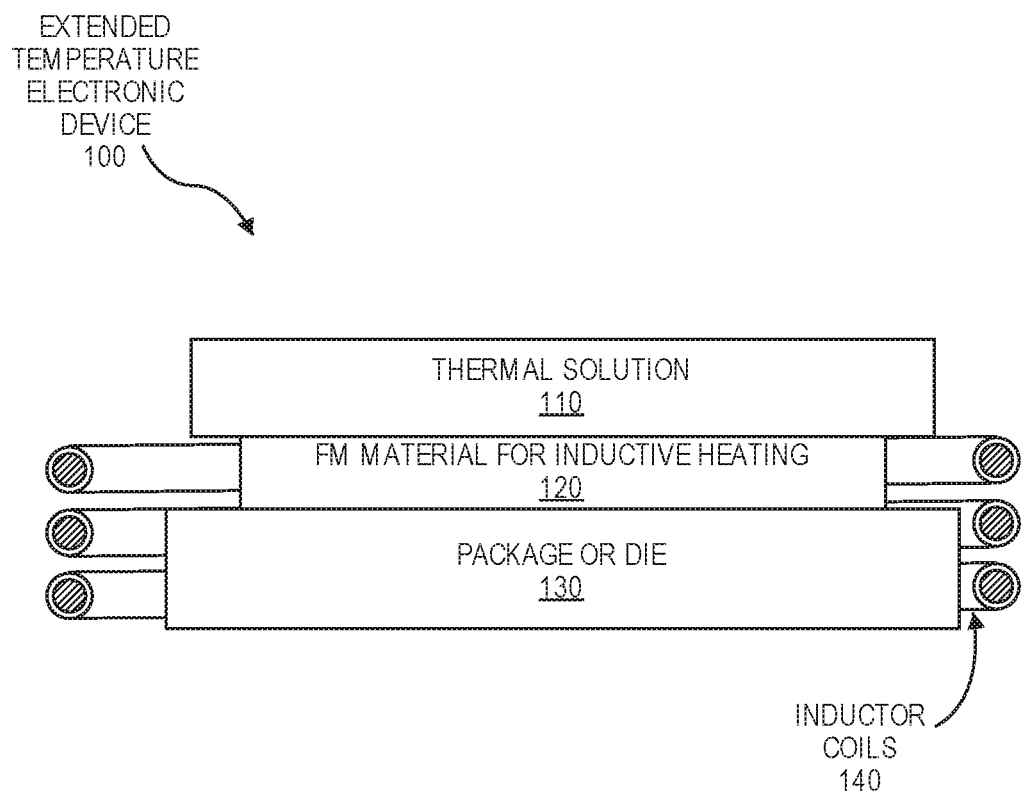
FIG. 1 is an illustration of an extended temperature electronic device including induction heating according to an embodiment.

FIG. 1 is an illustration of an extended temperature electronic device including induction heating according to an embodiment. In some embodiments, an extended temperature electronic device 100 includes a package or die 130 with a thermal solution for cooling 110, to which is added ferromagnetic material 120 to provide induction heating. In some embodiments, inductor coils 140 are placed in a location to surround the ferromagnetic material 120 at least in part, wherein a high frequency alternating current through the inductor coils is to generate a rapidly alternating magnetic field and create eddy currents within the ferromagnetic material 120, and thus generate heat within the ferromagnetic material.

In some embodiments, an apparatus or system may utilize existing temperature sensors to detect a temperature below a certain threshold temperature and engage the inductive heating when required. In some embodiments, an apparatus or system may allow for delaying of boot operation or other action based on a temperature below a threshold temperature.

In some embodiments, an apparatus or system further allows for tuning and scalability for particular use and environment. While a change in heating requirements for a conventional heating coil ay be expected to require a significant change in components and design, the modification of heating in an embodiment of a conductive heating apparatus or system may be addressed with a change in current in the inductive coil 140 or a change in programming for the enablement and disablement of the inductive heating. A control unit may vary the ramp up rate depending on the particular usage, with an inductive coil allowing for a wide range of options in operation.

In some embodiments, an apparatus or system utilizing inductive heating provides for a simpler design for manufacturing. Adding a conventional heater is generally a manual task providing a greater potential for error in comparison with fabrication of an inductive heating system. Further, an inductive heating system may be easier to repair if a failure occurs as the inductive coil is generally easier to maintain in comparison with conventional heat elements.

In some embodiments, implementations may vary depending on the device or usage. In some embodiments, the ferromagnetic material 130 may be provided within a heatsink base (or other thermal solution) or between a heatsink and package in an integrated heat spreader (IHS), as further illustrated in FIGS. 3 and 4. Further, the inductive coils 140 may be placed in varying locations depending on the particular implementation.

A particular control operation is not required in an embodiment of an inductive heating system for an electronic device 100, but rather may vary depending on the particular device or usage. In some embodiments, a temperature sensor may be an external ambient temperature sensor. In some embodiments, a temperature sensor may be, for example, a sensor on a CPU device, which be read quickly before booting up the device. In some embodiments, the control system may be implemented dependent on a design by a customer.

Further, the design of an inductive heat structure may have minimal or no effect on the thermal solution 110 for cooling of a device 100. In a particular example, a heatsink and integrated heat spreader for a device are at least in part designed for height restrictions. An embodiment of an inductive heat element may be implemented by adding ferromagnetic material to enable the heating for the IHS or heatsink, without requiring modification of the portion of the apparatus that is provided to address high temperatures.

In the fabrication of an electronic device, the type of ferromagnetic material 130 to be included to provide inductive heating may vary depending on implementation, including, for example, steel and other known materials.

Cold temperatures have been addressed conventionally using, for example, a specialized chassis with heaters present inside the chassis that can raise the localized temperature to allow operation at negative ambient temperatures.

Figure 2:
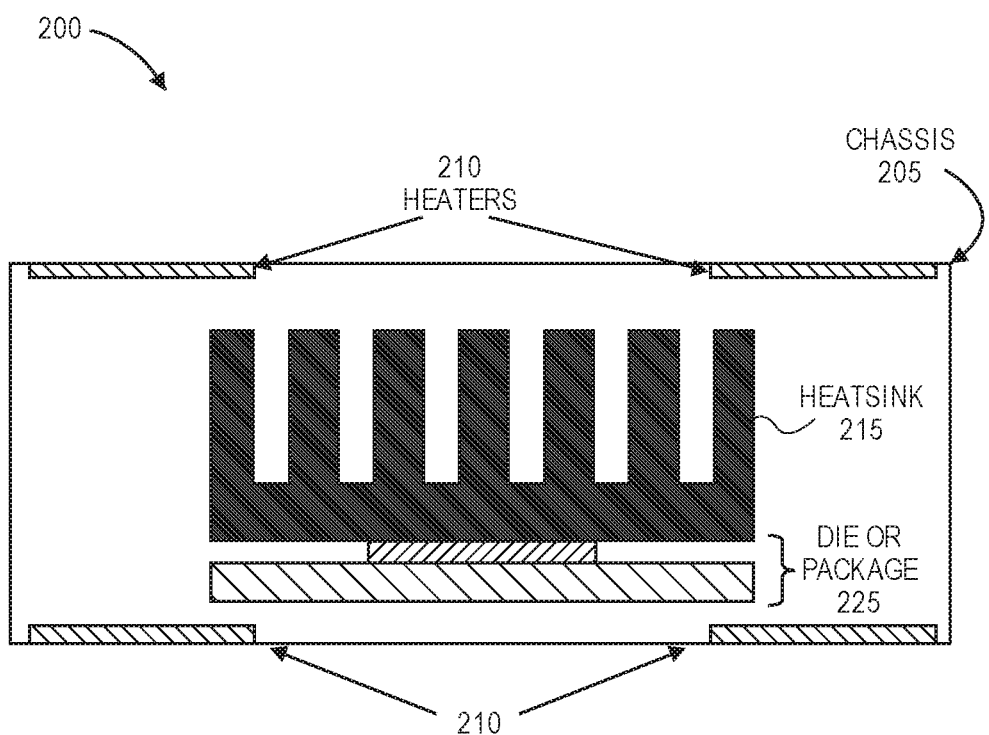
FIG. 2 is an illustration of a conventional external heat source for heating of an electronic device.

FIG. 2 is an illustration of a conventional external heat source for heating of an electronic device. As illustrated in FIG. 2, a system 200 includes a chassis 205 to retain and direct heat, and one or more heaters 210 to generate external heat for a package 225 with heatsink 215.

However, this conventional approach is not power efficient, and provides slow ramp/boot-up rates. In the conventional system 200, heat elements 210 are generally resistive heat elements that may be provided around or near certain electronics to heat certain electronics up to an operating temperature. However, conventional heating elements are not power efficient as the heat is generally dissipated in multiple directions, and the heat must penetrate the electronics in order to provide effective heating. Conventional heating thus generally requires an enclosure, such as the specialized chassis 205, to control dissipation of heat, but this structure does not effectively direct heat to the elements that require heating.

Further, if a conventional heating element is instead provided within an electronic package rather than externally (as shown in FIG. 2), then the heating element may interfere with the thermal cooling solution for such package, thus reducing cooling efficiency of package.

In some embodiments, inductive heating may be provided to achieve higher temperature ramp rates with improved efficiency in comparison with a conventional system as follows:

(1) Install layers of ferromagnetic materials within a base of a heatsink (or other thermal solution) or within an IHS for a package or die, wherein the heatsink and ferromagnetic material together may be referred to as a heatsink assembly or package.

(2) Install induction coils installed around the heatsink assembly/package to provide for inductive heat operation. The system may further including connection of a control unit to control heat operation and a high frequency oscillator to generate the alternating current for the induction coils.

In operation:

(3) Detect temperature conditions at system start up to determine if heating is required.

(4) Upon encountering low temperature conditions, drive AC current through the concentric coils around the heatsink or package, thereby creating an alternating magnetic field and resulting in heat generation in the ferromagnetic material in the heatsink base or IHS.

In an embodiment, no heat is produced in the remainder of the heatsink or the die directly because the materials (non-ferromagnetic materials) have very low permittivity. The inductive heating allows for flexible heater design, wherein the induction element can be sized and powered independently of heatsink size to achieve the desired ramp-up rates. Further, the heating is more uniform in comparison with conventional solutions because the heat is generated within the ferromagnetic material.

Figure 3:
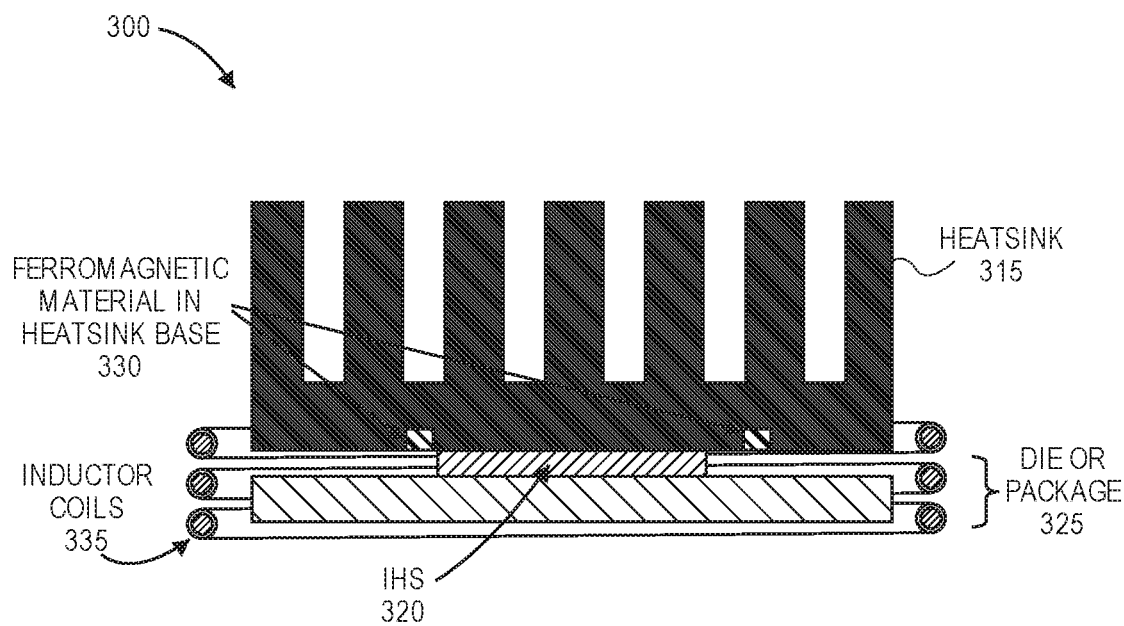
FIG. 3 is an illustration of an electronic device with ferromagnetic material embedded in a thermal solution for inductive heating according to an embodiment.

FIG. 3 is an illustration of an electronic device with ferromagnetic material embedded in a thermal solution for inductive heating according to an embodiment. In some embodiments, an electronic device 300 includes a package or die 325 coupled with integrated heat spreader 320, to which is coupled a thermal solution for cooling such as heatsink 315. In some embodiments, ferromagnetic material 330 is embedded into a base of the heatsink 315 to provide inductive heating.

In some embodiments, inductor coils 335 are placed around the electronic device 300, wherein a high frequency alternating current through the inductor coils is to generate a rapidly alternating magnetic field, the magnetic field passing through the ferromagnetic material thus creating eddy currents within the ferromagnetic material 330, and generating heat within the ferromagnetic material.

Figure 4:
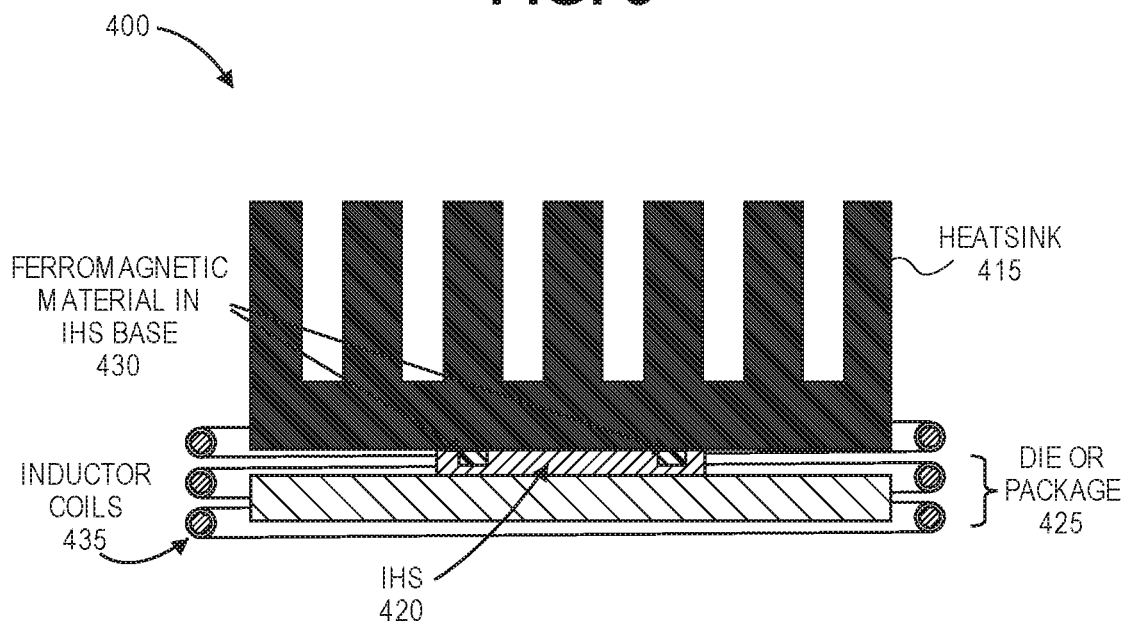
FIG. 4 is an illustration of an electronic device with ferromagnetic material installed between a thermal solution and die or package for inductive heating according to an embodiment.

FIG. 4 is an illustration of an electronic device with ferromagnetic material installed between a thermal solution and die or package for inductive heating according to an embodiment. In some embodiments, an electronic device 400 includes the package or die 425 coupled with integrated heat spreader 420, to which is coupled a thermal solution for cooling such as heatsink 415. In some embodiments, ferromagnetic material 430 is disposed between the heatsink 415 and die or package 425, such as embedding in IHS base 420 to provide inductive heating.

In some embodiments, inductor coils 435 are placed around the electronic device 400, wherein a high frequency alternating current through the inductor coils is to generate a rapidly alternating magnetic field, the magnetic field passing through the ferromagnetic material creating eddy currents within the ferromagnetic material 430, and thus generate heat within the ferromagnetic material.

In some embodiments, the inductive heating as illustrated in FIGS. 3 and 4 improves power delivery efficiency in comparison with conventional device heating. Induction heating has been shown to be significantly more power-efficient than indirect resistive heating. Typical efficiencies in a resistive heater are 20-40%, while the efficiency may be as high as 80-90% in an induction heater. The high efficiency is due in large part because the induction coils 335/435 do not dissipate heat to the neighboring parasitic elements (air, non-ferromagnetic materials in the vicinity). Thus, there is significant heat generation with reduced current in comparison with resistive heating. The resistive heaters in a conventional chassis can require anywhere from 10-15 Watts depending on the system thermal mass to bring the die temperature up. With an induction based system only a fraction of this power is needed due to its direct heat application and efficiency. The power requirements include operation of an oscillator to produce high frequency current oscillation in the coils and thus to generate an alternating magnetic field.

Further, the generation in the inductive heater element operates more quickly than generation by indirect resistive heating. This results in faster ramp rates for the same energy use, which may be twice as fast or better. The improved thermal ramp rate assists in meeting faster boot up requirements.

In the implementation of an inductive heat apparatus such as illustrated in FIGS. 3 and 4, the heatsink and IHS design is generally independent of the negative temperature requirements. For implementation of inductive heating, a ferromagnetic alloy (which does not need to present uniformly) may be added or embedded on the heatsink base or IHS, wherein the ferromagnetic allow is constructed of high permittivity ceramic or low-CTE (coefficient of thermal expansion) ferromagnetic metal alloy.

Figure 5:
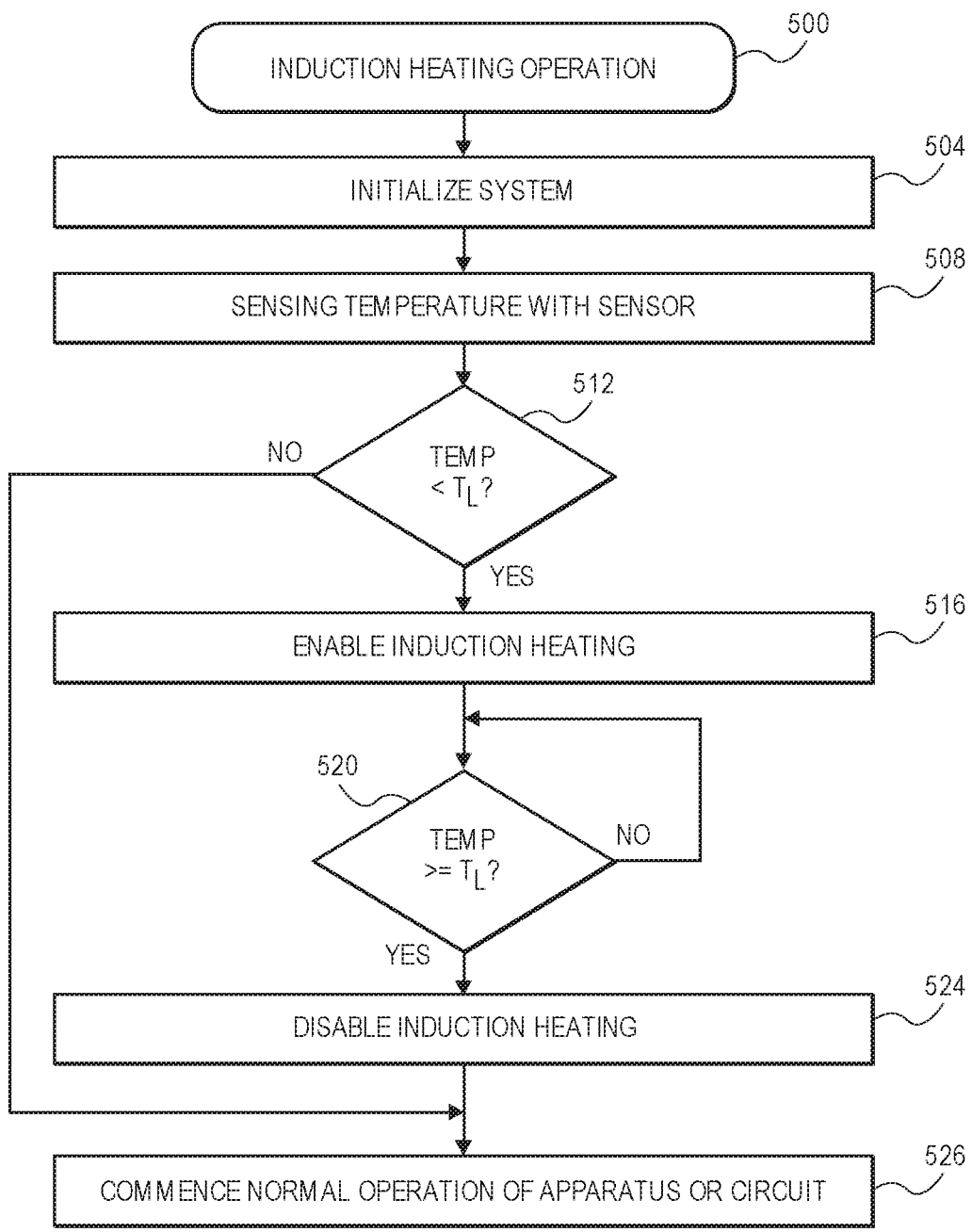
FIG. 5 is a flowchart to illustrate induction heating operation for an electronic apparatus or system according to an embodiment.

FIG. 5 is a flowchart to illustrate induction heating operation for an electronic apparatus or system according to an embodiment. In some embodiments, an induction heating process 500 may include the following:

504: initializing an apparatus or system including an electronic device with induction heating.

508: Sensing a temperature with a temperature sensor, wherein the temperature sensor may be in including in multiple locations such as external temperature sensor or a sensor within the electronic device.

512: Determining whether the sensed temperature is below a certain threshold low temperature, referred to herein as $T_L$.

516: If the sensed temperature is below the threshold low temperature $T_L$, then enabling induction heating 516, wherein enabling inductive heating includes enable an alternating current in inductor coils to generate heat n ferromagnetic material of the electronic device.

520: Determining whether the sensed temperature rises such that it is equal to or above the threshold low temperature $T_L$.

524: When the sensed temperature is equal to or above the threshold low temperature $T_L$, then disabling the induction heating, wherein disabling the inductive heating includes disabling the alternating current in the inductor coils.

526: Upon disabling the induction heating 524 or the initial temperature being equal to or above the threshold low temperature $T_L$, then commencing normal operation of the apparatus or system.

Figure 6:
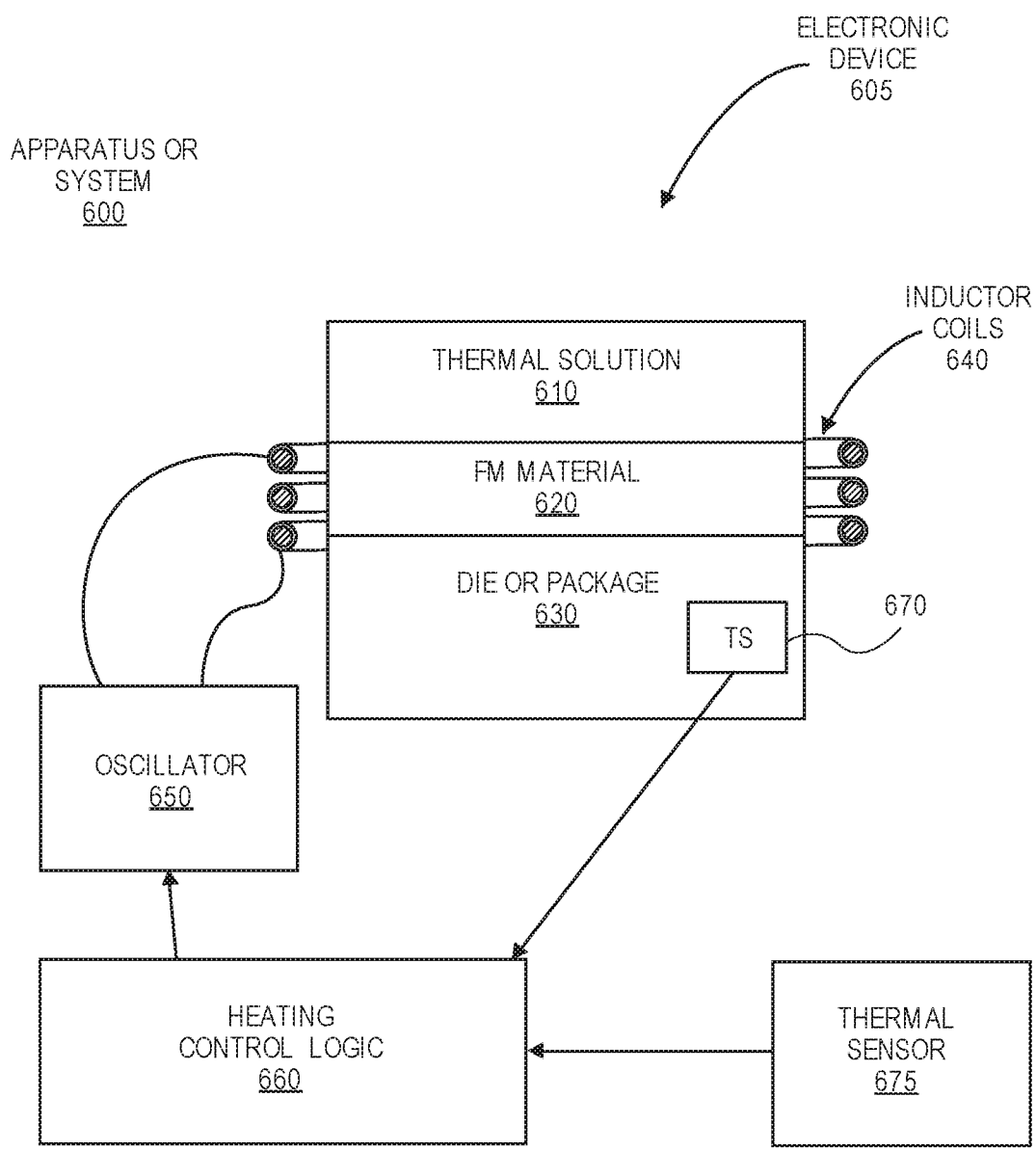
FIG. 6 is an illustration of an apparatus or system including an electronic device with inductive heating according to an embodiment.

FIG. 6 is an illustration of an apparatus or system including an electronic device with inductive heating according to an embodiment. In some embodiments, an electronic device 605 includes a package or die 630 with a thermal solution for cooling 610, to which is added ferromagnetic material 620 for inductive heating. In some embodiments, inductor coils 640 are placed in a location to surround the ferromagnetic material, wherein a high frequency alternating current through the inductor coils is to generate a rapidly alternating magnetic field and create eddy currents within the ferromagnetic material 620, and thus generate heat within the ferromagnetic material.

In some embodiments, the apparatus or system 600 includes heating control logic 660, which may be separate from the electronic device 605 or may be a part of such electronic device 605. In some embodiments, the heating control logic 660 obtains a temperature signal from a temperature sensor, wherein the temperature sensor may be a part of the electronic device 605, shown as TS 670, or may be external to the electronic device 605, shown as thermal sensor 675. In some embodiments, the thermal sensor may be existing thermal sensor utilized for thermal or power control for the electronic device 605.

In some embodiments, the heating control logic 660 is to enable an oscillator 650 to provide a high frequency alternating current in the inductor coils 640 to generate a rapidly alternating magnetic field for purpose of generating heat in the ferromagnetic material 620, wherein the heating control logic 660 may be operable to enable the oscillator 650 when a sensed temperature is below a certain threshold temperature and to disable the oscillator when the sensed temperature is equal to or above the threshold temperature.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes: an electronic device including a die or package, a thermal solution coupled with the die or package for cooling of the die or package, and ferromagnetic material. In some embodiments, the ferromagnetic material is to generate induction heating of the die or package in response to an alternating magnetic field.

In some embodiments, the apparatus further includes inductor coils, the inductor coils surrounding the electronic device at least in part to generate the alternating magnetic field.

In some embodiments, the thermal solution includes a heatsink.

In some embodiments, the ferromagnetic material is embedded in the thermal solution.

In some embodiments, the ferromagnetic material is disposed between the thermal solution and the die or package. In some embodiments, the electronic device further includes an integrated heater spreader between the thermal solution and the die or package, and wherein the ferromagnetic material is embedded in the integrated heater spreader.

In some embodiments, a system includes: an electronic device including a die or package, a heatsink coupled with the die or package for cooling of the die or package, and ferromagnetic material; and induction coils around the electronic device at least in part. In some embodiments, the ferromagnetic material is to generate induction heating of the die or package in response to an alternating magnetic field generated by the induction coils.

In some embodiments, the system further includes an oscillator to produce a high frequency alternating current in the induction coils to generate the alternating magnetic field.

In some embodiments, the system further includes a control logic to enable and disable operation of the oscillator.

In some embodiments, the system further includes a thermal sensor, wherein the control logic is to enable or disable the operation of the oscillator based at least in part on a signal from the thermal sensor. In some embodiments, the thermal sensor is a part of the electronic device. In some embodiments, the thermal sensor is external to the electronic device.

In some embodiments, the ferromagnetic material is embedded in a base of the heatsink.

In some embodiments, the ferromagnetic material is disposed between the heatsink and the die or package. In some embodiments, the electronic device further includes an integrated heater spreader between the heatsink and the die or package, and wherein the ferromagnetic material is embedded in the integrated heater spreader.

In some embodiments, a non-transitory computer-readable storage medium includes stored thereon data representing sequences of instructions that, when executed by a processor, cause the processor to perform operations comprising: initializing a system including an electronic device, the electronic device including ferromagnetic material for induction heating; receiving a temperature signal; upon determining based on the temperature signal that a temperature is below a threshold temperature, enabling the induction heating of the electronic device; and upon determining based on the temperature signal that a temperature is above the threshold temperature, disabling the induction heating of the electronic device.

In some embodiments, the electronic device includes ferromagnetic material, and wherein enabling the induction heating includes enabling an alternating current through induction coils that are coiled around the electronic device at least in part, and wherein disabling the induction heating includes disabling an alternating current through the induction coils.

In some embodiments, enabling and disabling the alternating current includes enabling or disabling operation of an oscillator.

In some embodiments, receiving the temperature signal includes receiving the temperature signal from a temperature sensor within the electronic device.

In some embodiments, receiving the temperature signal includes receiving the temperature signal from a temperature sensor that is external to the electronic device.

In some embodiments, an apparatus includes: means for initializing a system including an electronic device, the electronic device including ferromagnetic material for induction heating; means for receiving a temperature signal; means for enabling the induction heating of the electronic device upon determining based on the temperature signal that a temperature is below a threshold temperature; and means for disabling the induction heating of the electronic device upon determining based on the temperature signal that a temperature is above the threshold temperature.

In some embodiments, the electronic device includes ferromagnetic material, and wherein the means for enabling the induction heating includes means for enabling an alternating current through induction coils that are coiled around the electronic device at least in part, and wherein the means for disabling the induction heating includes means for disabling an alternating current through the induction coils.

In some embodiments, the means for enabling and means for disabling the alternating current include means for enabling and means for disabling operation of an oscillator.

In some embodiments, the means for receiving the temperature signal includes means for receiving the temperature signal from a temperature sensor within the electronic device.

In some embodiments, the means for receiving the temperature signal includes means for receiving the temperature signal from a temperature sensor that is external to the electronic device.

What is claimed is:

1. An apparatus comprising:
    an electronic device including:
        a die or semiconductor package,
        a thermal solution coupled with the die or package for cooling of the die or semiconductor package,
        a heat sink assembly having ferromagnetic material and non-ferromagnetic material, and
        inductor coils surrounding the heat sink assembly to create an alternating magnetic field when alternating current is driven in the inductor coils;
    wherein heat is generated in the ferromagnetic material in the heat sink assembly to generate induction heating of the die or semiconductor package, without generating heat in the non-ferromagnetic material in the heat sink assembly, in response to the alternating magnetic field and programming of the induction heating.

2. The apparatus of claim 1, further comprising inductor coils, the inductor coils surrounding the electronic device at least in part to generate the alternating magnetic field.

3. The apparatus of claim 1, wherein the thermal solution includes a heatsink.

4. The apparatus of claim 1, wherein the ferromagnetic material is embedded in the thermal solution.

5. The apparatus of claim 1, wherein the ferromagnetic material is disposed between the thermal solution and the die or semiconductor package.

6. The apparatus of claim 5, wherein the electronic device further includes an integrated heater spreader between the thermal solution and the die or semiconductor package, and wherein the ferromagnetic material is embedded in the integrated heater spreader.

7. A system comprising:
    an electronic device including:
        a die or semiconductor package,
        a heatsink assembly coupled with the die or package for cooling of the die or semiconductor package, and wherein the heat sink assembly comprises ferromagnetic material and non-ferromagnetic material; and
        induction coils around the electronic device at least in part to create an alternating magnetic field when alternating current is driven in the inductor coils;
    wherein heat is generated in the ferromagnetic material in the heat sink assembly to generate induction heating of the die or semiconductor package, without generating heat in the non-ferromagnetic material in the heat sink assembly, in response to the alternating magnetic field generated by the induction coils and programming of the induction heating.

8. The system of claim 7, further comprising an oscillator to produce a high frequency alternating current in the induction coils to generate the alternating magnetic field.

9. The system of claim 8, further comprising a control logic to enable and disable operation of the oscillator.

10. The system of claim 9, further comprising a thermal sensor, wherein the control logic is to enable or disable the operation of the oscillator based at least in part on a signal from the thermal sensor.

11. The system of claim 10, wherein the thermal sensor is a part of the electronic device.

12. The system of claim 10, wherein the thermal sensor is external to the electronic device.

13. The system of claim 7, wherein the ferromagnetic material is embedded in a base of the heatsink.

14. The system of claim 7, wherein the ferromagnetic material is disposed between the heatsink and the die or semiconductor package.

15. The system of claim 14, wherein the electronic device further includes an integrated heater spreader between the heatsink and the die or semiconductor package, and wherein the ferromagnetic material is embedded in the integrated heater spreader.

16. A non-transitory computer-readable storage medium having stored thereon data representing sequences of instructions that, when executed by a processor, cause the processor to perform operations comprising:
    initializing a system including an electronic device, the electronic device including a heat sink assembly having ferromagnetic material for induction heating material and non-ferromagnetic material, and inductor coils surrounding the heat sink assembly to create an alternating magnetic field when alternating current is driven in the inductor coils;
    receiving a temperature signal;
    upon determining based on the temperature signal that a temperature is below a threshold temperature, enabling the induction heating of the electronic device by generating heat in the ferromagnetic material in the heat sink assembly, without generating heat in the non-ferromagnetic material in the heat sink assembly, in response to the alternating magnetic field and programming of the induction heating; and
    upon determining based on the temperature signal that a temperature is above the threshold temperature, disabling the induction heating of the electronic device.

17. The medium of claim 16, wherein the electronic device includes ferromagnetic material, and wherein enabling the induction heating includes enabling an alternating current through induction coils that are coiled around the electronic device at least in part, and wherein disabling the induction heating includes disabling an alternating current through the induction coils.

18. The medium of claim 17, wherein enabling and disabling the alternating current includes enabling or disabling operation of an oscillator.

19. The medium of claim 16, wherein receiving the temperature signal includes receiving the temperature signal from a temperature sensor within the electronic device.

20. The medium of claim 16, wherein receiving the temperature signal includes receiving the temperature signal from a temperature sensor that is external to the electronic device.

* * * * *